United States Patent [19]
Josquin

[11] Patent Number: 5,302,536
[45] Date of Patent: Apr. 12, 1994

[54] METHOD OF MANUFACTURING A SEMICONDUCTOR DEVICE, IN WHICH ISOLATED CONDUCTOR TRACKS ARE PROVIDED ON A SURFACE OF A SEMICONDUCTOR BODY

[75] Inventor: Wilhelmus J. M. J. Josquin, Eindhoven, Netherlands

[73] Assignee: U.S. Philips Corporation, New York, N.Y.

[21] Appl. No.: 617,304

[22] Filed: Nov. 16, 1990

Related U.S. Application Data

[63] Continuation of Ser. No. 374,518, Jun. 29, 1989, abandoned.

[30] Foreign Application Priority Data

Jul. 13, 1988 [NL] Netherlands .................... 8801772

[51] Int. Cl.$^5$ ............................................. H01L 21/04
[52] U.S. Cl. .................................... 437/40; 437/41; 437/44
[58] Field of Search ........................ 437/40, 41, 44

[56] References Cited

U.S. PATENT DOCUMENTS

| | | | |
|---|---|---|---|
| 3,961,999 | 6/1976 | Antipov | 437/73 |
| 4,403,396 | 9/1983 | Stein | 437/36 |
| 4,546,540 | 10/1985 | Ueyanagi et al. | 437/41 |
| 4,755,477 | 7/1988 | Chao | 437/73 |
| 4,774,206 | 9/1988 | Willer | 437/41 |
| 4,981,809 | 1/1991 | Mitsuaki et al. | 437/41 |

OTHER PUBLICATIONS

F. H. De La Moneda, "Processes to Reduce and Control the P-type...", IBM Technical Disclosure Bulletin, vol. 25, No. 11B, Apr. 1983, pp. 6131-6142.

Primary Examiner—Brian E. Hearn
Assistant Examiner—Laura M. Holtzman
Attorney, Agent, or Firm—Paul R. Miller

[57] ABSTRACT

A method of manufacturing a semiconductor device is set forth, in which a conductive layer (21) and a first insulating layer (22) are provided on a surface (2) of a semiconductor body (1). A conductor track (5) with an insulating top layer (6) is formed in these layers and the top layer (6) is formed in a first insulating layer (22) by means of a first etching treatment. Further, while masking with the top layer (6), the conductor track (5) is formed in the conductive layer (21) by means of a second etching treatment, after which the conductor track (5) is provided with a side edge insulation (7). The surface (2) and the conductor track (5) with its top layer (6) are covered by a second insulating layer (24), which is then subjected to a third anisotropic etching treatment until this layer (24) has been removed from the surface (2) and the top layer (6). According to the invention, the second etching treatment is at least initially carried out so that the conductive layer (21) is etched isotropically, while the top layer (6) is then practically not attacked, cavities (31) are formed under the top layer (6) near its edges (30), after which the second insulating layer (24) is deposited in a thickness such that the cavities (31) are entirely filled with insulating material. Thus, the occurrence of leakage currents and shortcircuits between the conductor track (5) and the metallization (8; 9) to be provided on the insulation layers (6, 7) are avoided.

6 Claims, 2 Drawing Sheets

METHOD OF MANUFACTURING A SEMICONDUCTOR DEVICE, IN WHICH ISOLATED CONDUCTOR TRACKS ARE PROVIDED ON A SURFACE OF A SEMICONDUCTOR BODY

This is a continuation application of previous application Ser. No. 07/374,518, filed Jun. 29, 1989 (now abandoned) and all benefits of such earlier application are hereby claimed for this new continuation.

The invention relates to a method of manufacturing a semiconductor device, in which a conductive layer and a first insulating layer are provided on a surface of a semiconductor body. A conductor track with an insulating top layer is formed in these layers and the top layer is formed in the first insulating layer by means of a first etching treatment, further while using the top layer, the conductor track is formed in the conductive layer as a mask by means of a second etching treatment, after which the conductor track is provided with a side edge insulation that the surface and the conductor track with its top layer are covered by a second insulating layer. A third anisotropic etching treatment is carried out until this layer has been removed from the surface and the top layer. An anisotropic etching treatment is to be understood to mean an etching treatment, in which a layer to be etched is etched away practically only in the direction transverse to its surface. This is in contrast to an isotropic etching treatment, in which the layer to be etched is etched away also parallel to its surface at practically the same rate.

BACKGROUND OF THE INVENTION

Thus, an insulated conductor track is formed on the surface of the semiconductor body. Other conductor tracks can be provided over such a conductor track insulated at its upper side by the top layer and at its side edges by side edge insulation. The conductor track may be made, for example, of polycrystalline silicon or a metal, such as aluminium, while its insulation may be made, for example, of silicon oxide, silicon nitride, silicon oxynitride or another insulating material, such as, for example, aluminium oxide. The insulating top layer and the side edge insulation may also be made of different insulating materials. Such an insulated conductor track may be used in the semiconductor device, for example, as gate electrode and is then isolated from the semiconductor body by a thin layer of gate oxide, but use as an electrode connected to a semiconductor zone disposed in the semiconductor body or as a conductor interconnecting circuit elements in the semiconductor device is also possible.

A method of the kind mentioned in the opening paragraph is known from Published European Patent No. 081,999, in which, as an insulated conductor track, a gate electrode of a MOS transistor is formed. Semiconductor zones constituting the source and drain zones of this transistor are contacted with a metallization extending above the gate electrode. The first and second etching treatments, which are carried out in this known method, etch the conductive layer and the first insulating layer anisotropically so that the conductor track and the top layer disposed thereon have side edges directed substantially at right angles to the surface. As a result, the side edge insulation can be provided in a simple manner described.

A disadvantage of the known method is that in practice, when a metallization is provided over the insulated conductors that are formed, leakage currents or even shortcircuits can occur between the insulated conductors and this metallization.

SUMMARY OF THE INVENTION

The invention has inter alia for its object to improve the method mentioned in the opening paragraph in such a manner that the leakage currents or shortcircuits do not occur when a further metallization is provided over the insulated conductors.

According to the invention, the method mentioned in the opening paragraph is for this purpose characterized in that the second etching treatment is at least initially carried out so that the conductive layer is etched isotropically, while the top layer is then practically not attacked, cavities being formed under the top layer near its edges, after which the second insulating layer is deposited in such a thickness that the cavities formed are entirely filled with insulating material.

The invention is based on the recognition of the fact that the leakage currents or shortcircuits are obtained at that part of the insulation of the insulated conductor at which the top layer and the side edge insulations adjoin each other. The side edge insulations are comparatively thin at the area at which the top layer is disposed on the conductor track, which is inherent in the manner in which these side edge insulations are formed.

Due to the measure according to the invention, in which the conductive layer is at least initially etched isotropically, while the top layer is practically not attacked, cavities are formed under the top layer near its edges and these cavities are then filled with insulating material. As a result, an additional thickness is obtained for the side edge insulations at the area at which the top layer and the conductor track adjoin each other. As a result, the occurrence of leakage currents and shortcircuits between the conductor track and the metallization to be provided on its insulations is avoided.

Preferably, the method according to the invention is characterized in that the second etching treatment is carried out initially isotropically, but later anisotropically, so that the conductive layer is etched away partly isotropically and partly anisotropically. Thus, it is achieved that the conductor track has at the surface o width which is practically equal to that of the masking top layer. If the conductive layer should be etched isotropically throughout its thickness, the width of the conductor track at the surface strongly depends upon the time for which the etching treatment is continued after the surface beside the conductor track has been reached. Such a continued etching treatment is necessary in practice to be sure that conductive material beside the conductor track is removed. Such an inaccuracy of the width of the conductor track is undesirable, particularly if the conductor track is used as gate electrode of a MOS transistor. During an additional continuation of the anisotropic etching treatment according to the invention, which is necessary of course for the same reason as stated above, the width is practically not influenced.

Preferably, according to the invention, the conductive layer is etched away isotropically over 25 to 75% of its thickness. Thus, it is achieved that not only the cavities under the top layer are sufficiently large to obtain the desired better isolation of the conductor, but also the conductor track has at its foot a sufficiently large thickness. If the conductor track is too thin at this area, loss of width can occur also during an anisotropic etching treatment. In practice, both requirements are satisfied when the conductive layer is etched isotropically over a part of about 50% of its thickness.

BRIEF DESCRIPTION OF THE DRAWINGS

The invention will now be described more fully, by way of example, with reference to a drawing. In the drawing.

DESCRIPTION OF THE PREFERRED EMBODIMENTS

Figure 1:
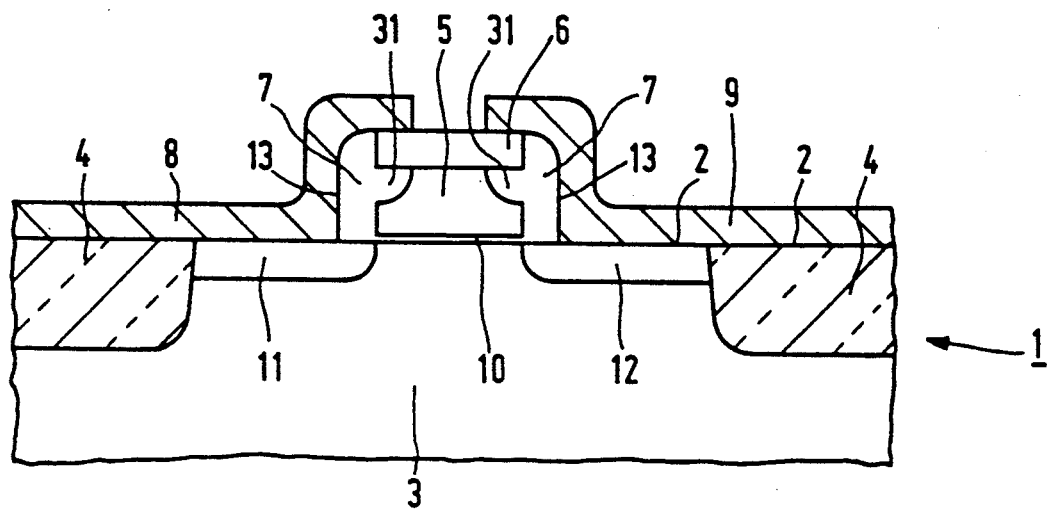
FIGS. 1, 2, 3 and 4 show a few stages of manufacture of a semiconductor device, which is obtained by means of the method according to the invention.

FIGS. 1 to 4 show the manufacture of a semiconductor device, which is obtained by means of the method according to the invention. The starting material is a semiconductor body of silicon 1 having a surface 2, which is adjoined by a semiconductor zone 3 and field oxide regions 4 manufactured in a usual manner. An insulated conductor track 5 is formed on the surface 2 and this track is insulated on the upper side by a top layer and is insulated at its side edges by a side edge insulation 7. Other conductor tracks 8 and 9 are provided over the insulated conductor track 5. In this embodiment, the conductor track 5 is used as a gate electrode and is insulated from the semiconductor zone 3 by a thin layer of gate oxide 10. Other applications of such an insulated conductor are also possible, however. For example, the latter may be connected to a semiconductor zone (not shown) located in the semiconductor body 1. Such a conductor may also interconnect circuit elements in the semiconductor device. For the sake of simplicity, only the use of a gate electrode is shown in the Figures. In the embodiment, the insulated conductor 5 constitutes the gate electrode of a MOS transistor having the source and drain zones constituted by semiconductor zones 11 and 12 formed in the semiconductor zone 3. The semiconductor zone 3 is, for example, of the p-conductivity type with a doping concentration of about $10^{15}$ atoms per cm$^3$. The source and drain zones 11 and 12 are then of the n-conductivity type with a doping concentration of, for example, about $5 \times 10^{19}$ atoms per cm$^3$.

Figure 2:
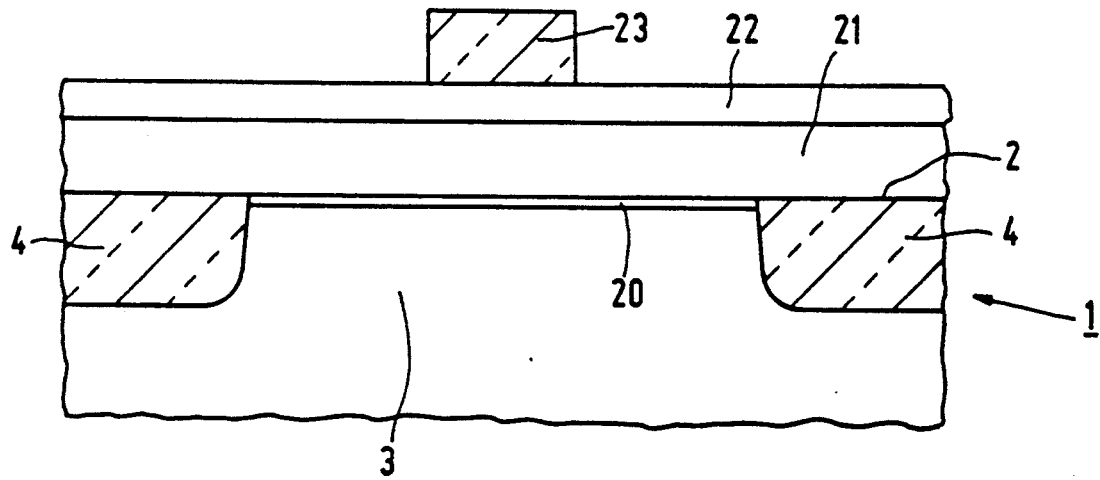

Before the insulated conductor 5 is formed on the surface 2, the semiconductor zone 3 is provided in FIG. 2 with an about 20 nm thick layer of gate oxide 20 by heating the semiconductor body in an oxygen-containing gas. Subsequently, an about 0.5 μm thick conductive layer 21 and an about 0.3 μm thick first insulating layer 22 are provided on the surface 2. These layers can be provided in a usual manner by deposition from the gaseous phase (i.e. chemical vapour deposition). The conductive layer 21 may be made, for example, of polycrystalline silicon, a metal, a metal silicide or a combination thereof. The insulating top layer 6 and the side edge insulation 7 may be made of silicon oxide, silicon nitride, silicon oxynitride or another insulating material, such as, for example, aluminium oxide. The top layer 6 and the side edge insulation 7 may then be made of the same material, but also may be made of different materials.

After the conductive layer 21 and the insulating layer 22 have been provided, a photoresist mask 23 is provided in a usual manner. The conductor track 5 with insulating top layer 6 is now formed from the layers 21 and 22 in that, while masking with the photoresist mask 23, the top layer 6 is formed from the first insulating layer 22 by means of a first anisotropic etching treatment and in that then, while masking with the top layer 6, the conductor track 5 is formed in the conductive layer 21 by means of a second etching treatment. During the second etching treatment, the photoresist mask 23 may still be present, but it may also be removed before the second etching treatment.

Figure 3:
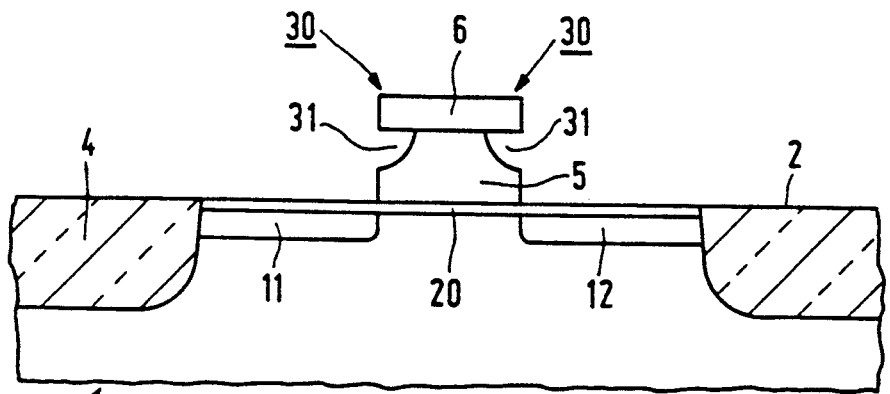

After the conductor track 5 and the insulating top layer 6 have been formed, the source and drain zones 11 and 12 of the MOS transistor are formed in a usual manner in FIG. 3. The zones 11 and 12 are formed, for example, by ion implantation followed by heat treatment.

Figure 4:
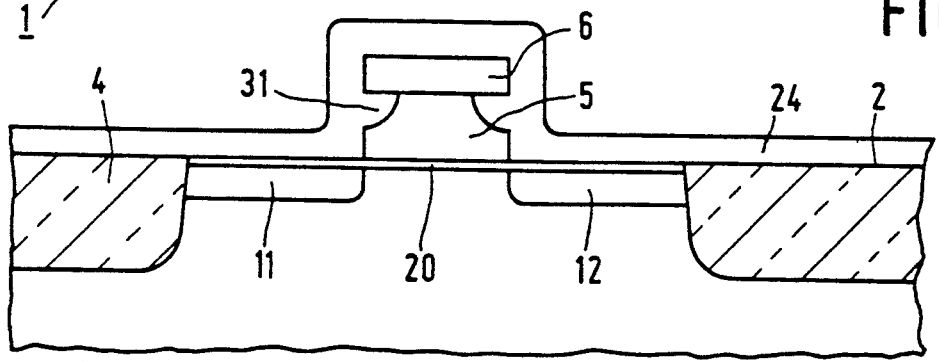

The conductor track 5 is then provided with the side insulation 7 in FIG. 4 in that the surface 2 and the conductor track 5 with its top layer 6 are covered by a second, about 0.25 μm thick insulating layer 24 of, for example, silicon oxide, which is deposited in a usual manner at low pressure from the gaseous phase (Low Pressure Chemical Vapour Deposition). This insulating layer 24 may also be made of other materials, such as silicon oxynitride, silicon nitride or of aluminium oxide. The second insulating layer 24 is now subjected to a third anisotropic etching treatment until this layer has been removed from the surface 2 and the top layer 6. The parts of this layer then left constitute the side edge insulation 7.

Subsequently, the metallization 8 in FIG. 1 for contacting the source and drain zones 11 and 12 of the MOS transistor is provided in a usual manner. This metallization may be made of aluminium, polycrystalline silicon or, for example, also of a metal silicide. Since the conductor track 5 is insulated on the upper side by the top layer 6 and at its side edges by the side edge insulation 7, the metallization 8 can partly overlap the conductor track.

According to the invention, the second etching treatment, in which, while masking with the top layer 6, the conductive layer 21 is patterned, is at least initially carried out so that the conductive layer 21 is etched isotropically, while the top layer is then practically not attacked. Cavities 31 in FIG. 3 are then formed under the top layer 6 near its edges 30. The second insulating layer 24 is deposited in a thickness such that the cavities 31 formed, as indicated in FIG. 4, are entirely filled with insulating material. After the third anisotropic etching treatment, in which the side edge insulation 7 is formed, the side edge insulations 7 have at the area at which the top layer 6 and the conductor track 5 adjoin each other an additional thickness which is formed by insulating material present in the cavities 31. As a result, the occurrence of shortcircuits between the conductor track 5 and the metallization 8 is avoided.

Figure 5:
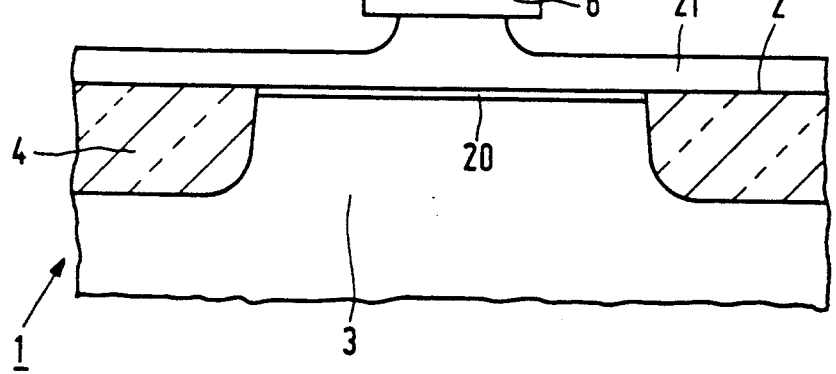
FIGS. 5 and 6 show a few stages of manufacture of a semiconductor device, which is obtained by means of a preferred embodiment of the method according to the invention.
Figure 6:
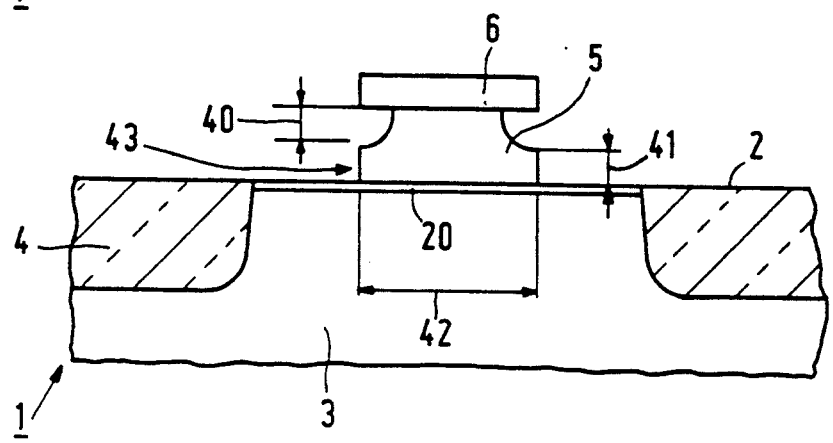

Preferably, as shown in FIGS. 5 and 6, the second etching treatment, in which, while masking with the top layer 6, the conductor track 5 is formed, is carried out initially isotropically (FIG. 5), but later anisotropically (FIG. 6) so that the conductive layer 21 is etched away isotropically for a part indicated by a grade mark 40 and anisotropically for a part indicated by a grade mark 41. If the layer 21 should be etched away isotropically throughout its thickness, the side edge insulation 7 would be additionally thick at the area at which the top layer 6 and the conductor track 5 adjoin each other. However, in the manner described above, it is also achieved that the width of the conductor track 5 indicated by a grade mark 42 is practically independent of the time for which the etching treatment must be continued to be sure that insulating material has been removed from the surface 2 and the top layer 6. During the isotropic etching treatment, the width at the foot of the conductor track 5 strongly depends upon the additional continuation of the etching treatment.

Preferably, according to the invention, the conductive layer 21 is etched away isotropically over 25 to 75% of its thickness. Thus, it is achieved that not only the cavities 31 under the top layer 6 are sufficiently large to obtain the desired better insulation of the conductor 5, but also the conductor track 5 has a sufficiently large thickness 41 at its foot 43. If the isotropic etching treatment is continued for an excessively long time, such a small quantity of insulating material is left during the anisotropic etching treatment that loss of width can then also occur. In practice, both requirements are satisfied if the conductive layer 21 is etched isotropically over about 50% of its thickness.

In order to be sure that the cavities 31 are satisfactorily filled during deposition of the second insulating layer 24 and to be sure that the side edge insulations 7 have a smooth surface 13, according to the invention, the second insulating layer is deposited in a thickness which is practically equally large as the part 40 of the thickness of the conductive layer 21 which is etched away isotropically.

The isotropic etching treatment of the conductive layer 21 of polycrystalline silicon described above may be carried out, for example, in an etching plasma produced in a gas mixture of tetrafluoromethane ($CF_4$) and oxygen. The subsequent anisotropic etching treatment of the remaining layer of polycrystalline silicon 21 may be carried out, for example, such that first for a few tens of seconds etching is carried in an etching plasma produced in a gas mixture comprising tetrachloromethane ($CCl_4$) and chlorine and then for a few minutes etching is carried out in an etching plasma produced in a gas mixture containing chlorine until the polycrystalline silicon has been removed from the surface 2.

It will be appreciated that within the scope of the invention many further variations are possible for those skilled in the art. For example, the conductor tracks 8 and 9 may be provided in the same manner as the conductor track 5 with an insulating top layer and side edge insulations. A conductor track such as the conductor track 5 may also be used, for example, on an insulating layer covering the semiconductor device shown in FIG. 1.

I claim:
1. A method of manufacturing a semiconductor device comprising steps of
    (a) depositing a conductive layer on a surface of a semiconductor body,
    (b) depositing an insulating layer on said conductive layer,
    (c) forming a mask on said insulating layer,
    (d) etching said insulating layer about said mask to form an insulating top layer portion and to expose said conductive layer,
    (e) etching said conductive layer to form a conductor track by using at least said insulating top layer portion as a second mask, said step of etching said conductive layer being initially carried out isotropically to form cavity portions in said conductive layer beneath side edges of said insulating top layer portion, and thereafter anisotropically etching said conductive layer from said cavity portions to said surface to form side edges of said conductor track parallel to said side edges of said insulating top layer portion,
    (f) forming a second insulating layer over said insulating top layer portion and said side edges of the underlying said conductor track, said second insulating layer entirely filling said cavity portions with insulating material, and
    (g) anisotropically etching said second insulating layer to remove said second insulating layer from said insulating top layer portion and from at least portions of said surface, said second insulating layer remaining in said cavity portions and at said side edges of said conductor track.

2. A method according to claim 1, wherein said isotropic etching in step (e) is carried out over 25 to 75% of a thickness of said conductive layer to form said cavity portions.

3. A method according to claim 2, wherein said isotropic etching in step (e) is carried out over approximately 50% of said thickness of said conductive layer.

4. A method according to claim 3, wherein said step (f) is carried out to form a thickness of said second insulating layer, said thickness being approximately equal to a distance to which said isotropic etching in step (e) is carried out on said conductive layer.

5. A method according to claim 1, wherein said step (f) is carried out to form a thickness of said second insulating layer, said thickness being approximately equal to a distance to which said isotropic etching in step (e) is carried out on said conductive layer.

6. A method according to claim 1, wherein said side edges of said conductor track are approximately in the same plane as said side edges of said insulating top layer portion.

* * * * *